(12) United States Patent
Yang et al.

(10) Patent No.: US 12,195,824 B2
(45) Date of Patent: Jan. 14, 2025

(54) METHOD AND DEVICE FOR PREPARING ULTRATHIN METAL LITHIUM FOIL

(71) Applicant: SHENZHEN YANYI NEW MATERIALS CO., LTD., Shenzhen (CN)

(72) Inventors: Kai Yang, Shenzhen (CN); Shi-Qi Zhang, Shenzhen (CN); Wei-Jing Feng, Shenzhen (CN); Xiao-Fei Zhang, Shenzhen (CN); Chao Qian, Shenzhen (CN); Min Yue, Shenzhen (CN); Bo Liu, Shenzhen (CN)

(73) Assignee: SHENZHEN YANYI NEW MATERIALS CO., LTD., Guangdong (CN)

( * ) Notice: Subject to any disclaimer, the term of this patent is extended or adjusted under 35 U.S.C. 154(b) by 57 days.

(21) Appl. No.: 18/252,620

(22) PCT Filed: Nov. 1, 2021

(86) PCT No.: PCT/CN2021/127947
§ 371 (c)(1),
(2) Date: May 11, 2023

(87) PCT Pub. No.: WO2022/111228
PCT Pub. Date: Jun. 2, 2022

(65) Prior Publication Data
US 2024/0011124 A1    Jan. 11, 2024

(30) Foreign Application Priority Data

Nov. 30, 2020  (CN) .......................... 202011376686.6

(51) Int. Cl.
*C22B 26/12* (2006.01)
*B01D 3/10* (2006.01)
(Continued)

(52) U.S. Cl.
CPC ................ *C22B 26/12* (2013.01); *B01D 3/10* (2013.01); *B01D 3/143* (2013.01); *C22B 5/04* (2013.01);
(Continued)

(58) Field of Classification Search
CPC ............. C22B 26/12; C22B 5/04; C22B 5/10; B01D 3/10; B01D 3/143; C23C 14/16; C23C 14/24; C23C 14/562
See application file for complete search history.

(56) References Cited

U.S. PATENT DOCUMENTS

2012/0103826 A1   5/2012  Gordon et al.
2015/0267277 A1   9/2015  Wohlgemuth
2022/0307108 A1*  9/2022  Zhou ........................ C22B 5/16

FOREIGN PATENT DOCUMENTS

BR   102018016312   3/2020
CN      1299884      6/2001
(Continued)

OTHER PUBLICATIONS

Vacuum Metallurgy, Dai Yongnian et al., Metallurgical Industry Press, pp. 222-223 with machine translation, dated Mar. 31, 1988.
(Continued)

*Primary Examiner* — Michael P Wieczorek
(74) *Attorney, Agent, or Firm* — Ruggiero McAllister & McMahon LLC (57) ABSTRACT

The present invention relates to a method and device for preparing an ultrathin metal lithium foil. With regard to the problems of lithium preparation processes in the prior art having a high lithium preparation reaction temperature, a low lithium recovery rate, low purity in collected lithium foils, a complicated process operation, etc., the present invention provides a method for preparing an ultrathin metal lithium foil, wherein firstly, a complex lithium salt is pre-
(Continued)

pared, the complex lithium salt and a reducing agent are then subjected to a vacuum thermal reduction reaction so as to generate a metal vapor, the metal vapor is then subjected to vacuum distillation, and finally, vacuum evaporation is used to prepare the ultrathin metal lithium foil of the present invention. In the present invention, by precisely regulating and controlling conditions such as the formulation of the complex lithium salt, the thermal reduction reaction temperature, the temperature of a distillation device, the vacuum degree, materials and the reducing agent, vacuum reduction, vacuum distillation and vacuum evaporation are continuously performed, and lithium preparation, distillation purification, and evaporation can thus be continuously performed, thereby improving the efficiency of the production of the ultrathin metal lithium foil and saving on preparation costs.

10 Claims, 4 Drawing Sheets

(51) Int. Cl.
| | | |
|---|---|---|
| B01D 3/14 | (2006.01) | |
| C22B 5/04 | (2006.01) | |
| C22B 5/10 | (2006.01) | |
| C22B 9/02 | (2006.01) | |
| C22B 9/04 | (2006.01) | |
| C23C 14/16 | (2006.01) | |
| C23C 14/24 | (2006.01) | |
| C23C 14/56 | (2006.01) | |

(52) U.S. Cl.
CPC .............. *C22B 5/10* (2013.01); *C22B 9/02* (2013.01); *C22B 9/04* (2013.01); *C23C 14/16* (2013.01); *C23C 14/24* (2013.01); *C23C 14/562* (2013.01)

(56) References Cited

FOREIGN PATENT DOCUMENTS

| CN | 1377425 | 10/2002 |
|---|---|---|
| CN | 103409648 | 11/2013 |
| CN | 104805312 | 7/2015 |
| CN | 106591596 | 4/2017 |
| CN | 108165768 | 6/2018 |
| CN | 109182758 | 1/2019 |
| CN | 111187924 | 5/2020 |
| CN | 113528859 | 10/2021 |
| DE | 102013016670 | 4/2014 |
| JP | 2007063615 | 3/2007 |
| RU | 2288289 | 11/2006 |

OTHER PUBLICATIONS

English International Search Report from corresponding PCT App No. PCT/CN202/1127947 dated Jan. 25, 2022.
First office action dated Jun. 27, 2022 in corresponding Chinese application 2020113766866 with machine translation.
Second office action dated Feb. 18, 2023 in corresponding Chinese application 2020113766866 with machine translation.
Rejection Notice dated Mar. 31, 2023 in corresponding Chinese application 2020113766866 with machine translation.

\* cited by examiner

METHOD AND DEVICE FOR PREPARING ULTRATHIN METAL LITHIUM FOIL

TECHNICAL FIELD

The present application relates to a method and a device for preparing a metal lithium foil, and especially, to a continuous preparation method and a continuous preparation device for an ultrathin metal lithium foil.

BACKGROUND

Lithium-ion batteries have the advantages of high energy density, no memory effect, high operating voltage and excellent cycle stability, and have been widely used in small mobile devices, energy storage power stations and other fields. With the development of electric vehicles (EVs), hybrid electric vehicles (HEVs) and unmanned aerial vehicles as well as the popularization and application of other large-scale energy storage devices, there are increasingly diversified requirements for energy storage devices. The development and application of EV or REV largely depends on the improvement of its power energy storage system, which requires that the energy storage device should have high specific energy and high specific power. The specific energy of conventional lithium-ion batteries is 100-200 $Whkg^{-1}$, which can no longer satisfy the needs of these devices.

Metal lithium has a high theoretical specific capacity, which approaches to 3860 mAh $g^{-1}$, and has a low redox potential (−3.04 V vs. SHE). Metal lithium is one of the best battery negative electrode materials, and can be combined with oxygen or sulfur to construct lithium-oxygen (Li—$O_2$) batteries and lithium-sulfur (Li—S) batteries. Both Li—$O_2$ batteries and Li—S batteries have extremely high theoretical specific energy, up to 11140 $Whkg^{-1}$ and 2600 $Whkg^{-1}$, respectively. These batteries all use metal lithium as the battery negative electrode and are collectively referred to as lithium batteries.

At present, the methods for preparing metal lithium mainly include molten salt electrolysis, metallothermic reduction and vacuum distillation. Molten salt electrolysis is a method for converting lithium salts into metal lithium, which has the advantages of high current efficiency and continuous production. However, this method has high energy consumption and pollutes the environment, and the obtained metal lithium has low purity. The metallothermic reduction is a method for converting lithium oxide into metal lithium by metal co-heating, which has the advantages of simple operation, no pollution and short process; however, the obtained metal lithium ingot has low purity; besides, the solely lithium oxide has poor fluidity, and the reaction with the reducing agent is not sufficient, resulting in a low recovery rate of lithium. Vacuum distillation can effectively reduce the content of impurity elements in metal lithium, which is a common method to obtain high-purity metal lithium. The method for preparing metal lithium foils is mainly the mechanical rolling method. Since this method is mainly used to process metal lithium ingots by mechanical rolling, the metal lithium is easy to stick to the rolling machine, and it is a huge challenge for the rolling device to prepare the ultrathin metal with a thickness of less than 20 microns, which may have large mechanical loss and high energy consumption.

The application CN1299884A discloses a thermal reduction preparation and purification process and a device for metal lithium, which includes the following steps: S1. $Li_2CO_3$ and $Al_2O_3$ are used as a raw material and an auxiliary respectively and subjected to cake compression and calcination to obtain clinker; S2. the clinker is mixed with a reducing agent and compressed into a cake and subjected to vacuum thermal reduction; S3. lithium vapor is subjected to primary distillation in a reduction furnace; and S4. the lithium vapor after the primary distillation is subjected to secondary distillation to obtain a metal lithium ingot. The shortcomings of this process lie in that the yield of $Li_2O$ produced from $Li_2CO_3$ raw material is low, the decomposition conditions of $Li_2CO_3$ are harsh, and the prepared metal lithium ingot will contain lots of dust impurities if no vapor filtration treatment is performed after the primary distillation.

The application CN1213158C discloses a method for preparing lithium from lithium carbonate. Lithium carbonate, quicklime and alumina are mixed and pelletized, and then calcined; the calcined particles are pulverized to obtain a powder; the powder is uniformly mixed with silicon iron, pelletized and subjected to vacuum thermal reduction; the resulting lithium vapor is condensed to obtain solid lithium. The shortcomings of this process lie in that the decomposition rate of lithium carbonate is not high, and secondly, the purity of the obtained product is not high without secondary distillation.

The application CN109182758A discloses a method and a system for preparing a ultrathin metal lithium strip from a low-grade lithium source. First, a low-grade lithium source, such as a metal lithium slag with a lithium content of 20%-99%, is subjected to evaporation in a vacuum environment to remove low-boiling impurities to obtain liquid metal lithium, and then the obtained liquid metal lithium is deposited on a substrate by vacuum evaporation method to form a ultrathin metal lithium strip. This process uses heating and evaporation to remove impurities from a solid low-grade metal lithium source, and the achieved distillation effect is ordinary. The remaining impurities in the evaporation boat are lithium carbonate, lithium hydroxide, lithium chloride, etc., and these lithium impurities are not utilized, which leads to a relatively high cost of raw materials, and the purity of the prepared metal lithium foil is not necessarily high.

SUMMARY

Aiming at the problems of high reaction temperature for lithium production, low lithium recovery rate, low purity of the collected lithium foil, and complicated operation in the lithium production process in the prior art, the present application provides a method and a device for preparing an ultrathin metal lithium foil.

The present application adopts the following technical solutions.

[1] A method for preparing a ultrathin metal lithium foil is characterized in including the following steps:
  (1) step of preparing a composite lithium salt, wherein a lithium raw material is heated, cooled, and ball-milled to obtain a composite lithium salt with a chemical formula of $xLiOH \cdot yLi_2CO_3 \cdot zLi_2O$, wherein x, y and z are mass fractions, and $0<x<0.5$, $0<y<0.5$, $0.5<z<1$, and $x+y+z=1$;
  (2) step of performing vacuum thermal reduction, wherein the composite lithium salt is mixed with a reducing agent uniformly and compressed, and then subjected to vacuum thermal reduction in a vacuum reduction furnace to generate metal vapor;
  (3) step of performing vacuum distillation, wherein the metal vapor is introduced into a distillation tank via a heat exchange pipe and subjected to vacuum distillation, and thus lithium vapor in the metal vapor is condensed into metal lithium liquid, and the metal lithium liquid is stored in a lithium storage tank via a connection pipe; and (4) step of performing vacuum evaporation, wherein the metal lithium liquid in the lithium storage tank is introduced into a crucible of a vacuum evaporation device, heated to convert to lithium vapor and deposited on a substrate to form a uniform lithium foil.

[2] The method for preparing a ultrathin metal lithium foil according to [1] is characterized in that in step (I), the lithium raw material is heated from the room temperature to 600-800° C. at a heating rate of 1-10° C./min under a vacuum degree of 1-20 Pa and hold at the temperature for min, and ball-milled after natural cooling to obtain a composite lithium salt $xLiOH \cdot yLi_2CO_3 \cdot zLi_2O$, wherein x, y and z are mass fractions, and $0<x<0.5$, $0<y<0.5$, $0.5<z<1$, and $x+y+z=1$;

the lithium raw material is one or at least two of lithium hydroxide-lithium carbonate, lithium hydroxide-lithium carbonate-lithium oxalate and lithium hydroxide-lithium oxalate, and the ball-milled composite lithium salt has a particle size of 20 μm≤D50≤70 μm and a ball-to-material mass ratio of (10-15):1.

[3] The method for preparing a ultrathin metal lithium foil according to [1] is characterized in that in step (2), the composite lithium salt is uniformly mixed with a reducing agent according to a mass ratio of 1:(0.5-1.0), compressed into a cake under 10-60 MPa, and subjected to vacuum thermal reduction in a vacuum reduction furnace at 800-1000° C. and under a vacuum degree of 1-20 Pa to generate metal vapor;

the reducing agent is selected from one or at least two of a silicon powder, an aluminum powder, an iron powder and a carbon powder.

[4] The method for preparing a ultrathin metal lithium foil according to [1] is characterized in that in step (3), the metal vapor is introduced into a distillation tank via a heat exchange pipe and subjected to distillation, a temperature of the distillation tank is controlled at 300-400° C., and a vacuum degree is controlled at $10^{-2}$-$10^{-4}$ Pa, and thus lithium vapor in the metal vapor is condensed into metal lithium liquid, and the metal lithium liquid is stored in a lithium storage tank via a connection pipe, wherein the metal vapor in the heat exchange pipe is cooled from 800-1000° C. to 400-500° C., and a heat exchange liquid in the heat exchange pipe is heated at the same time, the heat exchange pipe is connected to a heat exchange jacket around the distillation tank, the distillation tank is heated to 300-400° C. via the heat exchange liquid and a heating device, and a ceramic filter with a pore size of 1-10 μm is arranged inside the heat exchange pipe;

sodium vapor and potassium vapor in the metal vapor are subjected to secondary distillation via a distillation pipe connected to the distillation tank, and thus the sodium vapor and the potassium vapor are condensed in a sodium-potassium condensation tank, a thermal insulation sleeve and a heating device are arranged outside the distillation pipe with an inner temperature of 320-420° C.

[5] The method for preparing a ultrathin metal lithium foil according to [1] is characterized in that in step (4), the metal lithium liquid in the lithium storage tank is introduced into a crucible of a vacuum evaporation device, heated to convert to lithium vapor and deposited on a substrate to form a uniform lithium foil, the lithium foil is collected via a substrate winding collection device, and the collected lithium foil is taken out under an inert atmosphere;

a vacuum degree in the vacuum evaporation device is $10^{-2}$-$10^{-4}$ Pa, a crucible heating temperature is 500-700° C., a distance between the crucible and the substrate is 20-50 mm, a winding speed of the winding collection device is 1-5 m/min, the substrate is an aluminum foil or a copper foil, and the inert atmosphere is a nitrogen atmosphere or an argon atmosphere.

[6] The method for preparing a ultrathin metal lithium foil according to [1] is characterized in that in step (4), a thickness of the prepared lithium foil is 1-20 μm, a lithium purity of the lithium foil is 99.96-99.99 wt %, and a recovery rate of the metal lithium is 81.7-85.0%.

[7] A device for preparing a ultrathin metal lithium foil is used to implement the method for preparing a ultrathin metal lithium foil according to [1] to [6], and the device is characterized in including a vacuum reduction furnace (2), a heat exchange pipe (5), a distillation tank (8), a distillation pipe (10), a sodium-potassium condensation tank (12), a lithium storage tank (14), and an evaporation chamber (16);

the vacuum reduction furnace (2) is connected to the distillation tank (8) via the heat exchange pipe (5), the distillation tank (8) is connected to the sodium-potassium condensation tank (12) via the distillation pipe (10), the distillation tank (8) is connected to the evaporation chamber (16) via the lithium storage tank (14).

[8] The device for preparing a ultrathin metal lithium foil according to [7] is characterized in that the vacuum reduction furnace (2), the heat exchange pipe (5), the distillation tank (8), and the distillation pipe (10) are all provided with a temperature sensor which displays real-time temperature;

a first vacuum pump (21) is arranged at an upper end of the vacuum reduction furnace (2), a feed inlet (1) is arranged at a lower end of the vacuum reduction furnace (2), and a slag storage tank (3) is arranged at a bottom of the vacuum reduction furnace (2);

an upper end of the distillation tank (8) is connected to the distillation pipe (10), a lower end of the distillation tank (8) is connected to a connection pipe (9), the distillation tank (8) is connected to the lithium storage tank (14) via a connection pipe (9), and the lithium storage tank (14) is connected to a vacuum evaporation chamber (16) via a connection pipe (9);

a sodium-potassium collection tank (13) is arranged at a bottom of the sodium-potassium condensation tank (12), and a second vacuum pump (22) is arranged at an upper end of the sodium-potassium condensation tank (12);

a third vacuum pump (23) is arranged at a lower end of the vacuum evaporation chamber (16).

[9] The device for preparing an ultrathin metal lithium foil according to [7] or [8] is characterized in that a cake-forming pressure device (4) is arranged inside the vacuum reduction furnace (2), a heat exchange jacket and a heating unit are arranged outside the distillation tank (8), and a cooling sleeve is arranged around the sodium-potassium condensation tank (12).

[10] The device for preparing an ultrathin metal lithium foil according to [7] or [8] is characterized in that a winding collection device (17), a crucible (18) and a vapor hood (19) are arranged inside the vacuum evaporation chamber (16), the crucible (18) is integrated with the vapor hood (19), and the crucible (18) is located below the vapor hood (19).

Compared with the prior art, the lithium raw material is processed into a composite lithium salt with specific component proportions in the present application, and the lithium raw material has wide source, high utilization rate, and good thermal reduction reaction effect; based on the vacuum reduction-vacuum distillation-vacuum evaporation continuous integrated process to produce metal lithium foils, the purity of metal lithium is improved, and the production efficiency is greatly improved, which is conducive to industrial production; the lithium for the evaporation process comes from lithium liquid in the distillation tank, which does not require pretreatment of solid lithium, and saves on the storage cost of metal lithium ingots; the particular formula of the composite lithium salt of the present application can promote the thermal reduction reaction to increase the recovery rate of metal lithium.

DETAILED DESCRIPTION

In this specification, where the mark "-" is used to describe a numerical range, both endpoints are included and have the same unit. For example, "1-20 Pa" means that the vacuum degree is more than or equal to 1 Pa and less than or equal to 20 Pa.

The raw materials, devices, test conditions and detection methods used in the examples are as follows.

The vacuum reduction furnace, distillation tank, vacuum pump and ball mill are purchased from Shanghai Jvjing Precision Instrument Manufacturing Co., Ltd., and the vacuum evaporation device and film thickness detector are purchased from Guangdong Huicheng Vacuum Technology Co., Ltd.

The XRD manufacturer is BRUKER, Germany; the model is Bruker D8; the XRD test conditions are: voltage of 40 KV, current of 40 Ma, Cu target, scanning range of 10-90°, step size of 0.02, and scanning speed of 10°/min.

The laser particle size analyzer is purchased from Zhuhai Truth Optical Instrument Co., Ltd., and the model is LT3600.

The ICP detector is purchased from Jiangsu Tianrui Instrument Co., Ltd.; the metal lithium foil obtained after the evaporation is subjected to chemical composition detection according to the conventional method, that is, the ICP test is performed to detect the purity of lithium in the lithium foil.

The film thickness detector can perform film thickness detection during the evaporation process.

The recovery rate of metal lithium is calculated according to the following steps.

A composite lithium salt is $xLiOH \cdot yLi_2CO_3 \cdot zLi_2O$, and a mass fraction of metal lithium is:

$$W=[6.94\times(x/23.95+y/36.94+z/14.94)]\times100\%$$

The composite lithium salt with a mass M is weighed out, and a mass (N) of metal lithium is $N=MW$; a mass of the substrate before evaporation is n, and a mass of the substrate after evaporation is m; then the recovery rate of metal lithium is $R=(m-n)/N$.

The present application will be described below in further detail with reference to the accompanying drawings and examples.

The present application provides a method for preparing an ultrathin metal lithium foil, which includes the following steps.

Step 1: Preparing a Composite Lithium Salt

A lithium raw material is one or more of a lithium hydroxide-lithium carbonate composite, a lithium hydroxide-lithium carbonate-lithium oxalate composite, and a lithium hydroxide-lithium oxalate composite, and a mass purity is more than 99%.

The lithium raw material in the examples of the present application is the battery-grade lithium raw material of Jiangxi Ganfeng Lithium Co., Ltd.

The lithium raw material (lithium hydroxide, lithium carbonate, and lithium oxalate) with a specific proportion is heated from the room temperature to 600-800° C. at a heating rate of 1-10° C./min under a vacuum degree of 1-20 Pa and hold at the temperature for 60-300 min, after natural cooling, the sample is taken out and shows as solid lumps. The sample is crushed by zirconium balls with a diameter of 5 mm, a ball-to-material mass ratio is (10-15):1, a rotation speed is 500-700 rpm, and a ball-milling time is 1-3 h. Composite lithium salt $xLiOH \cdot yLi_2CO_3 \cdot zLi_2O$ particles are obtained from the ball-milling, where x, y and z are mass fractions. The particle size D50 of the composite lithium salt $xLiOH \cdot yLi_2CO_3 \cdot zLi_2O$ is measured by a laser particle size analyzer, and the phase quantitative analysis of the composite lithium salt is carried out by using XRD test and GSAS software to determine the values of x, y and z. By adjusting the above lithium raw material ratio, heating rate, holding time and ball-milling conditions, the values of x, y and z may change, but as long as x, y and z satisfy the condition that $0<x<0.5$, $0<y<0.5$, $0.5\leq z<1$, and $x+y+z=1$, the thermal reduction reaction effect of the composite lithium salt of the present application can be achieved; x, y and z preferably satisfy the condition that $0<x<0.11$, $0<y<0.11$, $0.8\leq z\leq1$, and $x+y+z=1$; x, y and z more preferably satisfy the condition that $0.058\leq x<0.102$, $0.024\leq y\leq0.102$, $0.815\leq z\leq0.912$, and $x+y+z=1$.

Since the commercially available lithium salts are obtained by processing and purifying lithium-containing ores and lithium-containing salt lake brine, the lithium raw materials inevitably contain trace amounts of sodium salts, potassium salts, magnesium salts, and calcium salts.

Step 2: Performing Vacuum Thermal Reduction

The composite lithium salt particles and a reducing agent are uniformly mixed according to a mass ratio of 1:(0.5-1.0), preferably 1:(0.6-0.72), compressed into a cake under 10-60 MPa, and subjected to vacuum thermal reduction in a vacuum reduction furnace at 800-1000° C. for 4-10 h under a vacuum degree of 1-20 Pa to generate metal vapor. The reducing agent is selected from one or at least two of a silicon powder, an aluminum powder, an iron powder and a carbon powder.

By controlling the holding temperature and time in step 1, the lithium raw material is decomposed and converted into a composite lithium salt (lithium source) containing lithium oxide, lithium hydroxide, and lithium carbonate in a specific proportion of the present application, and the composite lithium salt is easier to realize metal thermal reduction with the reducing agent. When the temperature is higher than 450° C., lithium hydroxide will melt into liquid, bring certain fluidity to the composite lithium salt and the reducing agent, drive the diffusion of the composite lithium salt, increase the contact between the composite lithium salt and the reducing agent, and allow the thermal reduction reaction to be carried out more fully. The presence of a small amount of lithium carbonate is beneficial to the synergistic diffusion of lithium hydroxide and lithium oxide.

Step 3: Performing Vacuum Distillation

The metal vapor in step 2 first passes through a ceramic filter with a pore size of 1-10 μm to remove dust, and then introduced into a heat exchange pipe. The heat transfer between the metal vapor and the heat exchange liquid not only cools the metal vapor, but also heats the heat exchange liquid and then heats the distillation tank. The metal vapor is introduced into a distillation tank via the heat exchange pipe and subjected to distillation; a temperature of the distillation tank is controlled at 300-400° C., and a vacuum degree is controlled at $10^{-2}$-$10^{-4}$ Pa. The lithium vapor in the metal vapor is condensed into a metal lithium liquid, and the metal lithium liquid is stored in a lithium storage tank via a connection pipe; a thermal insulation jacket is arranged around the lithium storage tank; sodium vapor and potassium vapor in the metal vapor are introduced into a distillation pipe and condensed in a sodium-potassium condensation tank, after the condensation is complete, kerosene is added into the condensation tank and collected from a sodium-potassium collection tank. The kerosene plays the role of isolating sodium and potassium from air and moisture. The distillation pipe can condense and recycle the "escaped" lithium vapor in the sodium vapor and potassium vapor, a temperature of the distillation pipe is kept at 320-420° C., a material of the distillation pipe is a nickel-chromium alloy, and a material of the thermal insulation sleeve is phenolic resin; the metal vapor after passing through the heat exchange pipe is cooled from 800-1000° C. to 400-500° C., and the heat exchange liquid in the heat exchange pipe is heated at the same time, the heat exchange pipe is connected to the heat exchange jacket around the distillation tank, the distillation tank is heated to 300-400° C., and a heating device is arranged at the distillation pipe. A cooling sleeve is arranged around the sodium-potassium condensation tank with a cooling temperature of −10° C.

Since the lithium raw material inevitably contains a small amount of metallic compound impurities other than lithium, the obtained metal lithium also contains some corresponding metal impurities. Due to the different vapor pressures at the same temperature, different metals behave differently when being condensed. Therefore, in the vacuum distillation step, based on the metal lithium can be easily separated from the metal sodium and metal potassium impurities by precisely controlling the temperature.

Step 4: Performing Vacuum Evaporation

The metal lithium liquid in the lithium storage tank is introduced into a crucible of a vacuum evaporation device, heated to convert to lithium vapor and deposited on a substrate to form a uniform lithium foil, the lithium foil is collected via a winding collection device, and the collected lithium foil is taken out under an inert atmosphere. A substrate temperature is kept at 50-80° C. during the winding collection, a vacuum degree in the vacuum evaporation device is $10^{-2}$-$10^{-4}$ Pa, a crucible heating temperature is 500-700° C., a distance between the crucible and the substrate is 20-50 mm, a winding speed of the winding collection device is 1-5 m/min, the substrate is an aluminum foil or a copper foil, the inert atmosphere is a nitrogen atmosphere or an argon atmosphere, a thickness of the prepared lithium foil is 1-20 μm, preferably 1-15 μm, and more preferably 5-13 μm, a lithium purity of the lithium foil is 99.96-99.99 wt %, and a recovery rate of the metal lithium is 80.0-90.0%, preferably 81.7-85.0%.

The metal lithium liquid in the lithium storage tank can be introduced into the crucible of the vacuum evaporation device by using a liquid feed paddle, and the liquid feed paddle is rotated at a constant speed by electric power to transfer the metal lithium liquid into the crucible at a constant speed.

Vacuum evaporation is an effective method for preparing a ultrathin metal lithium foil at nanometer level or at tens of micrometers. By controlling the heating temperature of the crucible, the winding speed of the winding collection device, and the distance between the substrate and the crucible, the thickness of the metal lithium foil can be controlled at 1-20 μm, preferably 1-15 μm, and more preferably 5-13 μm. Such thickness is hard to achieve by the current calendering method, and is also a huge challenge to the calendering device. See the evaporation chamber (16) shown in FIG. 7 for a schematic structural diagram of the vacuum evaporation device.

Figure 7:
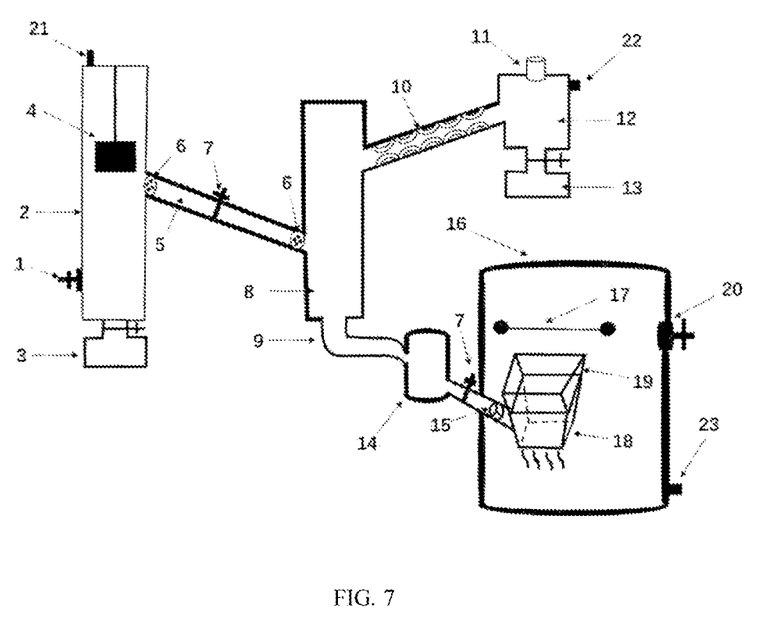
FIG. 7 is a schematic diagram of a device of the present application.

In addition, the present application provides a device for preparing a ultrathin metal lithium foil, which is used to implement the method for preparing a ultrathin metal lithium foil according to claim 1, and its characteristic is that the device includes the following components:

a feed inlet (1), a vacuum reduction furnace (2), a slag storage tank (3), a cake-forming pressure device (4), a heat exchange pipe (5), a ceramic filter (6), a valve (7), a distillation tank (8), a connection pipe (9), a distillation pipe (10), a kerosene feed inlet (11), a sodium-potassium condensation tank (12), a sodium-potassium collection tank (13), a lithium storage tank (14), a liquid feed paddle (15), an evaporation chamber (16), a winding collection device (17), a crucible (18), a vapor hood (19), a chamber door (20), a first vacuum pump (21), a second vacuum pump (22), a third vacuum pump (23), etc.

The vacuum reduction furnace (2) is connected to the distillation tank (8) via the heat exchange pipe (5), the distillation tank (8) is connected to the sodium-potassium condensation tank (12) via the distillation pipe (10), the distillation tank (8) is connected to the evaporation chamber (16) via the lithium storage tank (14).

The present application is also applicable to the preparation of metal magnesium foil, aluminum foil, nickel foil, tin foil, copper foil and zinc foil.

Example 1

Step 1: Preparing a Composite Lithium Salt

Lithium raw materials $0.85LiOH \cdot 0.15Li_2CO_3$ (by mass fraction) were uniformly mixed, heated to 600° C. at a heating rate of 5° C./min under a vacuum degree of 1 Pa, held at 600° C. for 150 min, and taken out after natural cooling. The sample taken out was solid lumps. The sample was crushed by a ball mill containing zirconium balls with a diameter of 5 mm, a ball-to-material mass ratio was 10:1, a rotation speed was 500 rpm, and a ball-milling time was 1 h. A composite lithium salt was obtained by ball-milling.

Figure 1:
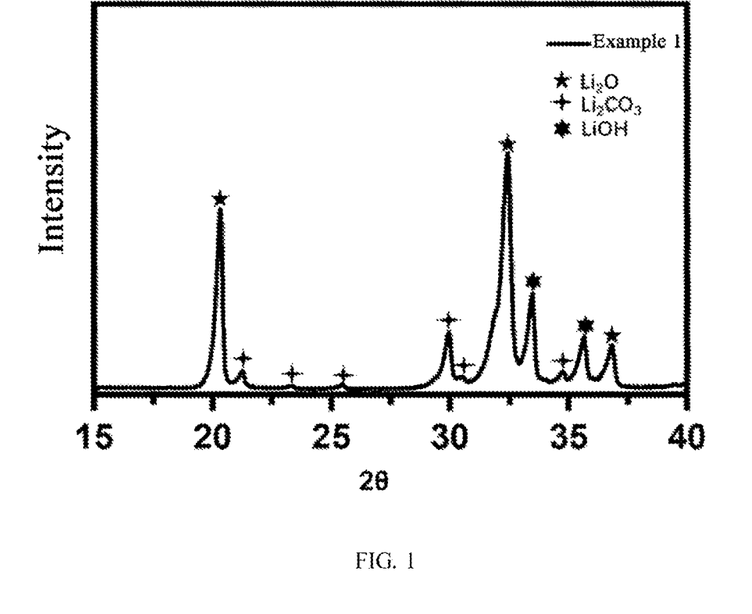
FIG. 1 is an XRD pattern of a composite lithium salt in Example 1 of the present application.
Figure 2:
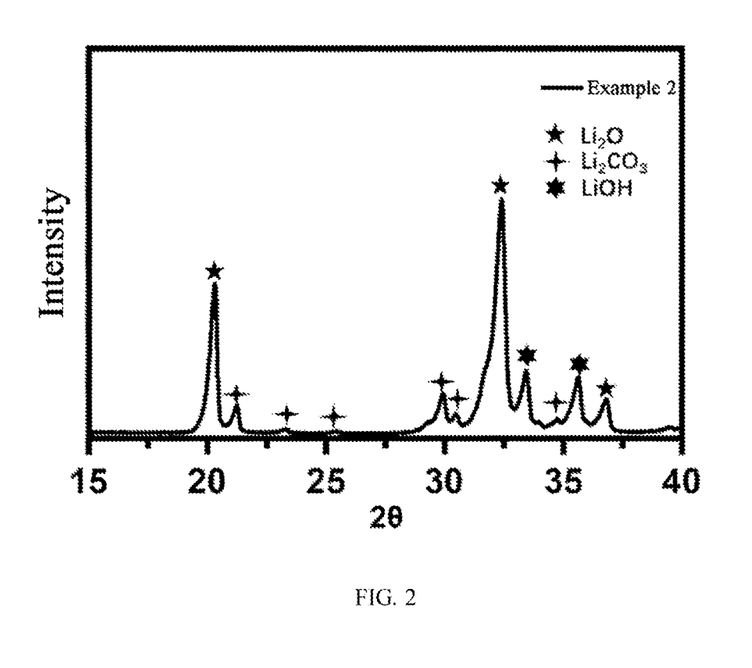
FIG. 2 is an XRD pattern of a composite lithium salt in Example 2 of the present application.
Figure 3:
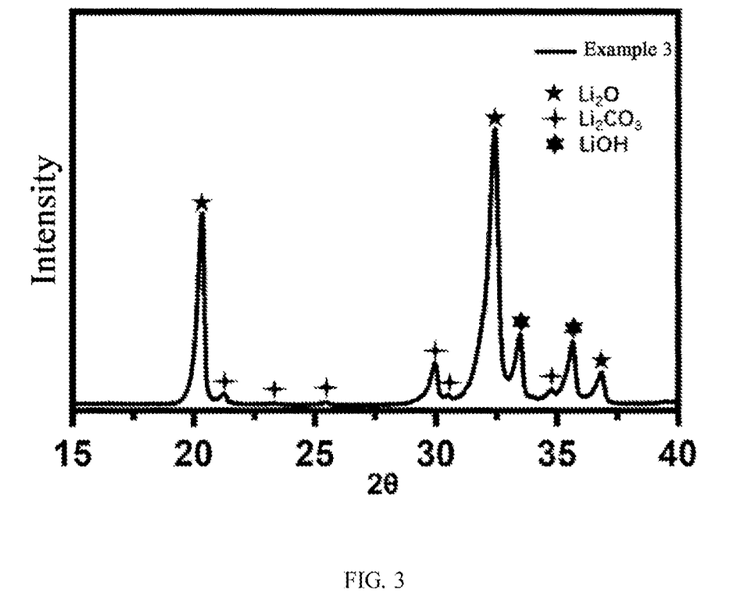
FIG. 3 is an XRD pattern of a composite lithium salt in Example 3 of the present application.
Figure 4:
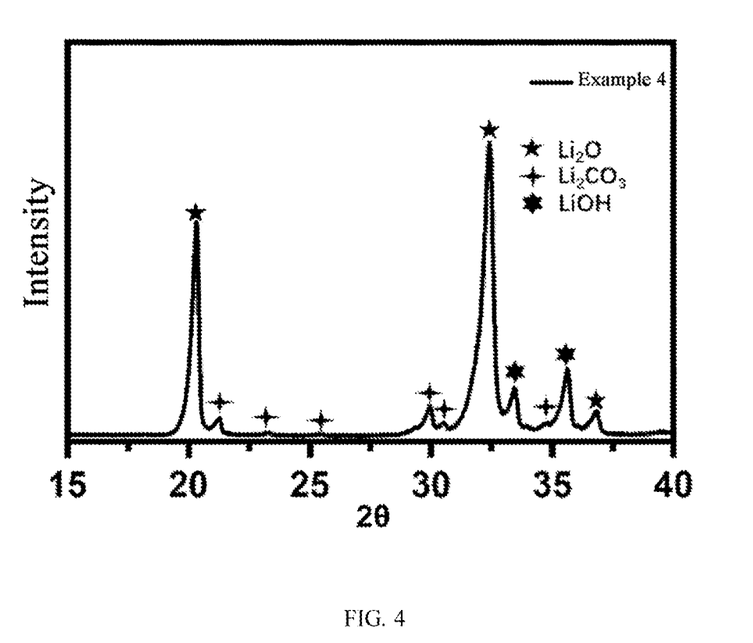
FIG. 4 is an XRD pattern of a composite lithium salt in Example 4 of the present application.
Figure 5:
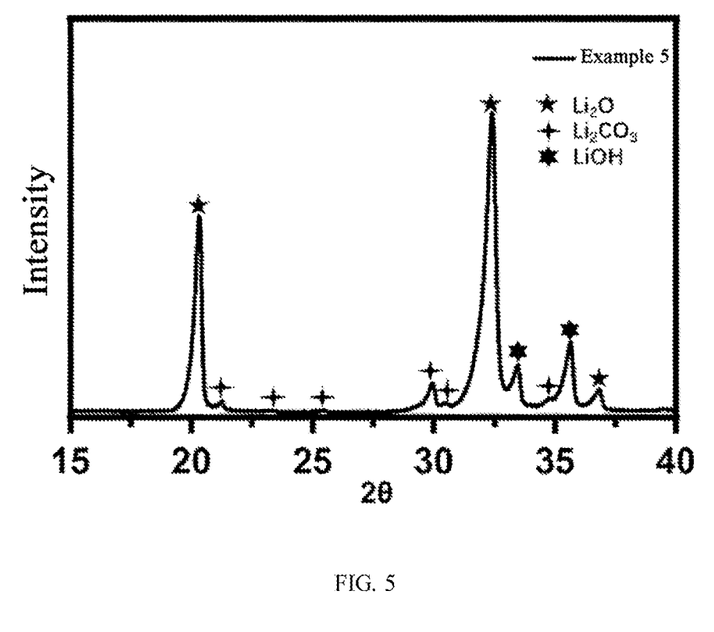
FIG. 5 is an XRD pattern of a composite lithium salt in Example 5 of the present application.
Figure 6:
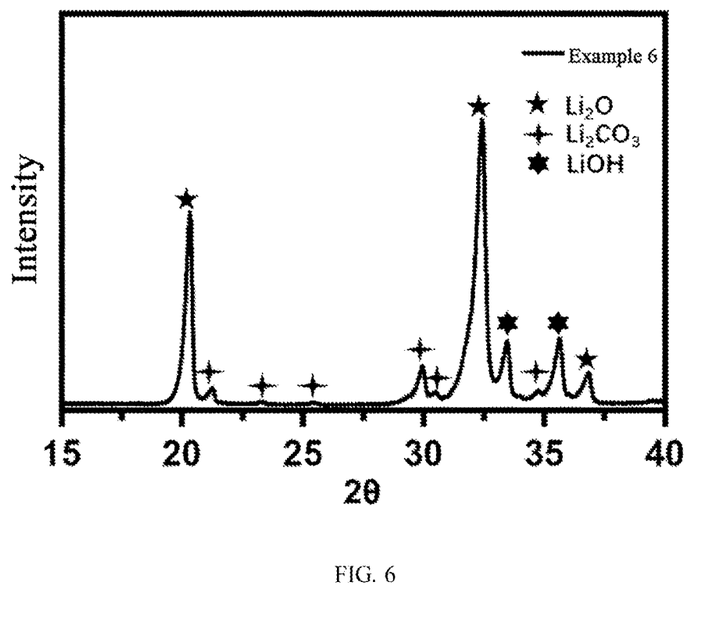
FIG. 6 is an XRD pattern of a composite lithium salt in Example 6 of the present application.

The particle size of the composite lithium salt is measured by a laser particle size analyzer, and the particle size D50 of the composite lithium salt is 30 μm. The phase qualitative and quantitative analysis of the composite lithium salt is carried out by using XRD test and GSAS software; as shown in FIG. 1, the diffraction pattern of the composite lithium salt of LiOH, $Li_2O$ and $Li_2CO_3$ is obtained, and the chemical composition is qualitatively analyzed by measuring the diffraction angle (peak position) and quantitatively analyzed by measuring the integrated intensity (peak intensity) of the spectral line. The chemical formula of the composite lithium salt is determined to be $0.0092LiOH·0.048Li_2CO_3·0.86Li_2O$.

Step 2: Performing Vacuum Thermal Reduction to Generate a Metal Vapor

According to a mass ratio of the composite lithium salt to a reducing agent aluminum powder being 1:0.7, 3.214 kg of the composite lithium salt (equivalent to 102.19 mol of $0.092LiOH·0.048Li_2CO_3·0.86Li_2O$) and 2.25 kg of the aluminum powder (equivalent to 83.40 mol Al atoms) were weighed out, mixed uniformly, compressed into a cake at 30 MPa, and subjected to vacuum thermal reduction in a vacuum reduction furnace under a vacuum degree of 1 Pa. The thermal reduction was performed at 800° C. for 611 to generate metal vapor.

Step 3: Performing Vacuum Distillation on the Metal Vapor

The metal vapor in step 2 first passed through a ceramic filter with a pore size of 1 μm to remove dust. Then the metal vapor passed through a heat exchange pipe, cooled from 800° C. to 400° C., and then introduced into a distillation tank and subjected to distillation; a temperature of the distillation tank was controlled at 400° C., and a vacuum degree was controlled at $5 \times 10^{-3}$ Pa. The lithium vapor in the metal vapor was condensed into a metal lithium liquid, and the metal lithium liquid was stored in a lithium storage tank via a connection pipe; sodium vapor and potassium vapor in the metal vapor were introduced into a distillation pipe and condensed in a sodium-potassium condensation tank, and a temperature of the distillation pipe was held at 320° C. The distillation pipe can condense and recycle the "escaped" lithium vapor in the sodium vapor and potassium vapor; the metal vapor was cooled from 800° C. to 400° C. via the heat exchange pipe, a heat exchange liquid in the heat exchange pipe was heated, the heat exchange pipe was connected to a heat exchange jacket around the distillation tank and transferred the exchanged heat to the distillation tank, and then the distillation tank was heated to 400° C. via a heating unit. A condensation jacket was arranged around the sodium-potassium condensation tank, and a cooling temperature was −10° C. to condense the sodium vapor and potassium vapor.

Step 4: Performing Vacuum Evaporation to Prepare a Ultrathin Metal Lithium Foil

The lithium metal liquid in the lithium storage tank was introduced into a crucible of the vacuum evaporation device through a liquid feed paddle, where the liquid feed paddle had three blades and was rotated at a constant speed by electric power, and the metal lithium liquid was transferred into the crucible at a constant speed. The crucible was heated to 600° C., and the metal lithium liquid was converted into lithium vapor, and then deposited on a substrate to form a uniform lithium foil. The substrate was wound via a winding collection device, and the lithium foil was collected at the same time. After the evaporation, argon was introduced, and the lithium toil was taken out. A vacuum degree of the vacuum evaporation device was $5 \times 10^{-3}$ Pa, a distance between the crucible and the substrate was 20 mm, a winding speed of the winding collection device was 1 m/min, a temperature for winding the substrate was 70° C., and the substrate was a copper foil.

A schematic diagram of the device used in this example is shown in FIG. 7, and the schematic diagram shows the device of the present application in a schematic manner rather than in actual size and proportion.

The thickness of the obtained lithium foil is measured by a film thickness detector. The chemical composition of the metal lithium foil obtained after evaporation is detected by an ICP detector to detect the lithium purity of the lithium foil. According to the above calculation steps of the recovery rate of metal lithium, the recovery rate of metal lithium is calculated.

The thickness of the lithium foil prepared in Example 1 is 13 μm, the lithium purity of the lithium foil is 99.99 wt %, and the recovery rate of metal lithium is 85.0%.

Examples 2-6

The steps of the preparation method are basically the same as those in Example 1, the difference lies in the components and parameters, and the specific information is shown in Tables 1-5.

Comparative Examples 1-4

The steps of the preparation method are basically the same as those in Example 1, the difference lies in the components and parameters, and the specific information is shown in Tables 1-5.

TABLE 1

| | Step 1: preparing a composite lithium salt | | | | |
| --- | --- | --- | --- | --- | --- |
| No. | Lithium raw material | Vacuum degree (Pa) | Heating rate (° C./min) | Thermal decomposition temperature (° C.) | Holding time (min) |
| Example 1 | $0.85LiOH—0.15Li_2CO_3$ | 1 | 5 | 600 | 150 |
| Example 2 | $0.75LiOH—0.25Li_2CO_3$ | 10 | 1 | 650 | 60 |
| Example 3 | $0.85LiOH—0.15Li_2C_2O_4$ | 15 | 3 | 700 | 120 |
| Example 4 | $0.80LiOH—0.10Li_2C_2O_4—0.10Li_2CO_3$ | 1 | 10 | 600 | 200 |
| Example 5 | $0.85LiOH—0.10Li_2C_2O_4—0.05Li_2CO_3$ | 20 | 5 | 800 | 300 |
| Example 6 | $0.85LiOH—0.15Li_2CO_3$ | 5 | 5 | 600 | 150 |
| Comparative Example 1 | $Li_2CO_3$ | 1 | 5 | 600 | 150 |
| Comparative Example 2 | $Li_2CO_3$ | 1 | 5 | 800 | 150 |
| Comparative Example 3 | LiOH | 1 | 5 | 600 | 150 |

TABLE 1-continued

| | | | | | | |
|---|---|---|---|---|---|---|
| Comparative Example 4 | LiOH | | 1 | 5 | 800 | 150 |

Step 1: preparing a composite lithium salt

| No. | Ball-to-material ratio | Rotation speed (r/min) | Ball-milling time (h) | Lithium salt | Particle size D50 of composite lithium salt (μm) |
|---|---|---|---|---|---|
| Example 1 | 10:1 | 500 | 1 | $0.092LiOH \cdot 0.048Li_2CO_3 \cdot 0.86Li_2O$ | 30 |
| Example 2 | 12:1 | 500 | 1 | $0.083LiOH \cdot 0.102Li_2CO_3 \cdot 0.815Li_2O$ | 70 |
| Example 3 | 13:1 | 600 | 2 | $0.062LiOH \cdot 0.026Li_2CO_3 \cdot 0.912Li_2O$ | 40 |
| Example 4 | 15:1 | 700 | 3 | $0.058LiOH \cdot 0.052Li_2CO_3 \cdot 0.89Li_2O$ | 40 |
| Example 5 | 10:1 | 700 | 1 | $0.068LiOH \cdot 0.024Li_2CO_3 \cdot 0.908Li_2O$ | 20 |
| Example 6 | 10:1 | 600 | 1 | $0.102LiOH \cdot 0.052Li_2CO_3 \cdot 0.846Li_2O$ | 50 |
| Comparative Example 1 | 10:1 | 500 | 1 | $0.42Li_2CO_3 \cdot 0.58Li_2O$ | 30 |
| Comparative Example 2 | 10:1 | 500 | 1 | $0.128Li_2CO_3 \cdot 0.872Li_2O$ | 30 |
| Comparative Example 3 | 10:1 | 500 | 1 | $0.248LiOH \cdot 0.752Li_2O$ | 30 |
| Comparative Example 4 | 10:1 | 500 | 1 | $0.102LiOH \cdot 0.898Li_2O$ | 30 |

TABLE 2

Step 2: performing vacuum thermal reduction

| No. | Reducing agent | Mass ratio of composite lithium salt to reducing agent | Composite lithium salt mass (kg) | Reducing agent mass (kg) | Cake-forming pressure (MPa) | Reduction vacuum degree (Pa) | Reduction temperature (° C.) | Thermal reduction time (h) |
|---|---|---|---|---|---|---|---|---|
| Example 1 | Aluminum powder | 1:0.7 | 3.214 | 2.25 | 30 | 1 | 800 | 6 |
| Example 2 | Silicon powder | 1:0.6 | 3.269 | 1.962 | 10 | 10 | 900 | 4 |
| Example 3 | Aluminum powder | 1:0.65 | 3.077 | 2.001 | 40 | 15 | 950 | 6 |
| Example 4 | Iron powder | 1:0.72 | 3.194 | 2.299 | 60 | 1 | 1000 | 10 |
| Example 5 | Carbon powder | 1:0.7 | 3.065 | 2.145 | 30 | 20 | 800 | 6 |
| Example 6 | Silicon powder + Aluminum powder | 1:0.7 | 3.168 | 2.217 | 50 | 1 | 800 | 8 |
| Comparative Example 1 | Aluminum powder | 1:0.7 | 3.214 | 2.25 | 30 | 1 | 800 | 6 |
| Comparative Example 2 | Aluminum powder | 1:0.7 | 3.214 | 2.25 | 30 | 1 | 800 | 6 |
| Comparative Example 3 | Aluminum powder | 1:0.7 | 3.214 | 2.25 | 30 | 1 | 800 | 6 |
| Comparative Example 4 | Aluminum powder | 1:0.7 | 3.214 | 2.25 | 30 | 1 | 800 | 6 |

TABLE 3

Step 3: performing vacuum distillation

| No. | Pore size of ceramic filter (μm) | Temperature of vapor after passing heat exchange pipe (° C.) | Distillation tank temperature (° C.) | Distillation tank vacuum degree (Pa) | Distillation pipe temperature (° C.) |
|---|---|---|---|---|---|
| Example 1 | 1 | 400 | 400 | $5 \times 10^{-3}$ | 320 |
| Example 2 | 1 | 450 | 300 | $6 \times 10^{-3}$ | 340 |
| Example 3 | 5 | 480 | 380 | $1 \times 10^{-3}$ | 320 |
| Example 4 | 3 | 500 | 400 | $1 \times 10^{-4}$ | 420 |
| Example 5 | 10 | 400 | 400 | $1 \times 10^{-2}$ | 320 |
| Example 6 | 8 | 400 | 400 | $5 \times 10^{-2}$ | 320 |

TABLE 3-continued

Step 3: performing vacuum distillation

| No. | Pore size of ceramic filter (μm) | Temperature of vapor after passing heat exchange pipe (° C.) | Distillation tank temperature (° C.) | Distillation tank vacuum degree (Pa) | Distillation pipe temperature (° C.) |
|---|---|---|---|---|---|
| Comparative Example 1 | 1 | 400 | 400 | $5 \times 10^{-3}$ | 320 |
| Comparative Example 2 | 1 | 400 | 400 | $5 \times 10^{-3}$ | 320 |
| Comparative Example 3 | 1 | 400 | 400 | $5 \times 10^{-3}$ | 320 |
| Comparative Example 4 | 1 | 400 | 400 | $5 \times 10^{-3}$ | 320 |

TABLE 4

Step 4: performing vacuum evaporation

| No. | Crucible temperature (° C.) | Vacuum degree (Pa) | Distance between crucible and substrate (mm) | Winding speed (m/min) | Substrate temperature (° C.) |
|---|---|---|---|---|---|
| Example 1 | 600 | $5 \times 10^{-3}$ | 20 | 1 | 70 |
| Example 2 | 600 | $6 \times 10^{-3}$ | 30 | 3 | 70 |
| Example 3 | 650 | $1 \times 10^{-3}$ | 40 | 2 | 70 |
| Example 4 | 500 | $1 \times 10^{-4}$ | 20 | 2 | 80 |
| Example 5 | 700 | $1 \times 10^{-2}$ | 20 | 5 | 80 |
| Example 6 | 650 | $5 \times 10^{-2}$ | 50 | 1 | 50 |
| Comparative Example 1 | 600 | $5 \times 10^{-3}$ | 20 | 1 | 70 |
| Comparative Example 2 | 600 | $6 \times 10^{-3}$ | 30 | 3 | 70 |
| Comparative Example 3 | 600 | $5 \times 10^{-3}$ | 20 | 1 | 70 |
| Comparative Example 4 | 600 | $6 \times 10^{-3}$ | 30 | 3 | 70 |

TABLE 5

| | Product information | | |
|---|---|---|---|
| No. | Thickness of lithium foil (μm) | Lithium purity (wt %) | Recovery rate of metal lithium (%) |
| Example 1 | 13 | 99.99 | 85.0 |
| Example 2 | 10 | 99.96 | 81.7 |
| Example 3 | 11 | 99.97 | 83.5 |
| Example 4 | 12 | 99.97 | 81.9 |
| Example 5 | 5 | 99.99 | 84.8 |
| Example 6 | 11 | 99.98 | 83.9 |
| Comparative Example 1 | 13 | 99.54 | 65.4 |
| Comparative Example 2 | 10 | 99.60 | 74.8 |
| Comparative Example 3 | 13 | 99.58 | 73.4 |
| Comparative Example 4 | 10 | 99.76 | 77.3 |

As shown in Table 5, by analyzing the test results of Examples 1-6 and Comparative Examples 1-4, it can be seen that compared with the composite lithium salt $xLiOH \cdot yLi_2CO_3 \cdot zLi_2O$ of Examples 1-6, the composite lithium salts of Comparative Examples 1-4 are a lithium carbonate-lithium oxide composite or a lithium hydroxide-lithium oxide composite, which are obtained by thermal decomposing the lithium raw material of lithium carbonate or the lithium raw material of lithium hydroxide, respectively. The recovery rates of the obtained metal lithium in Comparative Examples 1-4 are 65.4%, 74.8%, 73.4%, and 77.3%, respectively, and the recovery rates are significantly lower than those of Examples 1-6. A reason may be that the composite lithium salts of Examples 1-6 contain lithium hydroxide, lithium carbonate and lithium oxide in a specific proportion range; when the temperature is higher than 450° C., lithium hydroxide will melt into liquid, bring certain fluidity to the composite lithium salt and the reducing agent, drive the diffusion of the composite lithium salt, increase the contact between the composite lithium salt and the reducing agent, and allow the thermal reduction reaction to be carried out more fully; meanwhile, the presence of a small amount of lithium carbonate is beneficial to the synergistic diffusion of lithium hydroxide and lithium oxide, improving the recovery rate of metal lithium.

As shown in Table 5, by analyzing the test results of Comparative Examples 1 and 3 and Comparative Examples 2 and 4, it can be seen that the thermal decomposition temperature of Comparative Examples 1 and 3 is 600° C., and the thermal decomposition temperature of Comparative Examples 2 and 4 is increased to 800° C.; the decomposition rate of raw material component is significantly improved; compared with Comparative Examples 1 and 3, the lithium recovery rate of Comparative Examples 2 and 4 is significantly improved, but still lower than that of Examples 1-6, which also indicates that the synergistic effect of lithium hydroxide and lithium carbonate increases the efficiency of vacuum thermal reduction.

As shown in Table 5, by analyzing the test results of Examples 1-6 and Comparative Examples 1-4, it can be seen that that the lithium purity of Examples 1-6 is more than or equal to 99.96%, and the metal recovery rate is more than or equal to 81.7%, which are respectively higher than those of Comparative Example 1-4. A reason may be that by using the composite lithium salt as lithium raw material, the thermal reduction temperature is low, and the raw material utilization rate is higher; additionally, based on the vacuum reduction-vacuum distillation-vacuum evaporation continuous integrated process, the lithium source for the evaporation is the lithium liquid in the distillation tank, which does not require pretreatment of solid lithium, saves on the storage cost of metal lithium ingots, and greatly improves the production efficiency, thus improving the purity of metal lithium, and facilitating improving the recovery rate of metal lithium. The recovery rate of metal lithium of the present application is affected by the thermal reduction reaction raw materials, the reaction process and the industrial reaction device, and a substantial progress is achieved compared with the prior art.

The present application has the following beneficial effects.

1. In the present application, by precisely controlling the formula of the composite lithium salt, the temperature of thermal reduction reaction, the temperature of distillation device, the degree of vacuum, the material and the reducing agent, etc., and by continuously performing vacuum reduction, vacuum distillation and vacuum evaporation, the preparation, distillation purification and evaporation of lithium can be performed continuously, the production efficiency of a ultrathin metal lithium foil is improved, and the preparation cost is saved; a metal lithium foil with a thickness of 5-13 μm and a purity of more than or equal to 99.96 wt % is successfully obtained.

2. In the present application, by integrating the vacuum reduction furnace, distillation tank and evaporation device, the preparation and evaporation of lithium can be performed continuously; by using the heat exchange pipe as a connection pipe and arranging heat exchange devices around a plurality of device components, the "waste heat" can be reused; the integrated device can simplify the preparation process, improve the production efficiency of ultrathin metal lithium foil, improve the purity of metal lithium, reduce the introduction of external impurities, eliminate the material loss caused by material transfer between non-continuous devices, and reduce energy consumption and storage costs.

3. The composite lithium salt used in the present application promotes the thermal reduction reaction being carried out fully. When the temperature is higher than 450° C., lithium hydroxide will melt into liquid, bring certain fluidity to the composite lithium salt and the reducing agent, drive the more uniform diffusion of the composite lithium salt, increase the contact between the composite lithium salt and the reducing agent, and allow the thermal reduction reaction to be carried out more fully; the presence of a small amount of lithium carbonate is beneficial to the synergistic diffusion of lithium hydroxide and lithium oxide, improving the recovery rate of metal lithium.

4. The lithium source required for evaporation directly flows into the crucible in the form of a high-temperature liquid. Compared with the solid lithium ingot used in the traditional evaporation process, the lithium source requires no surface oxide treatment or packaging, reducing the lithium ingot storage costs, reducing energy consumption, and simplifying the complex process steps.

The above descriptions for all the disclosed examples are only the best examples of the present application and the technical principles, and are not intended to limit the present application. Those skilled in the art will understand, and various modifications to these examples will be apparent to those skilled in the art. Obviously, various modifications and variations made to the examples by those skilled in the art without departing from the spirit and scope of the present application all fall within the protection scope of the present application.

REFERENCE LIST OF THE ACCOMPANYING DRAWINGS 1. feed inlet; 2. vacuum reduction furnace; 3. slag storage tank; 4. cake-forming pressure device; 5. heat exchange pipe; 6. micron ceramic filter; 7. valve; 8. distillation tank; 9. connection pipe; 10. distillation pipe; 11. kerosene feed inlet; 12. sodium-potassium condensation tank; 13. sodium-potassium collection tank; 14. lithium storage tank; 15. liquid feed paddle; 16. vacuum evaporation chamber; 17. winding collection device; 18. crucible; 19. vapor hood; 20. chamber door; 21. first vacuum pump; 22. second vacuum pump; and 23. third vacuum pump.

What is claimed is:

1. A method for preparing an ultrathin metal lithium foil, comprising:
    (1) step of preparing a composite lithium salt, wherein a lithium raw material is heated, cooled, and ball-milled to obtain a composite lithium salt with a chemical formula of $xLiOH \cdot yLi_2CO_3 \cdot zLi_2O$, wherein x, y and z are mass fractions, and $0<x<0.5$, $0<y<0.5$, $0.5 \leq z<1$, and $x+y+z=1$;
    (2) step of performing vacuum thermal reduction, wherein the composite lithium salt is mixed with a reducing agent uniformly and compressed, and then subjected to vacuum thermal reduction in a vacuum reduction furnace to generate metal vapor;
    (3) step of performing vacuum distillation, wherein the metal vapor is introduced into a distillation tank via a heat exchange pipe and subjected to vacuum distillation, and thus lithium vapor in the metal vapor is condensed into metal lithium liquid, and the metal lithium liquid is stored in a lithium storage tank via a connection pipe; and
    (4) step of performing vacuum evaporation, wherein the metal lithium liquid in the lithium storage tank is introduced into a crucible of a vacuum evaporation device, heated to convert to lithium vapor and deposited on a substrate to form a uniform lithium foil.

2. The method for preparing a ultrathin metal lithium foil according to claim 1,
    wherein in step (1), the lithium raw material is heated from the room temperature to 600-800° C. at a heating rate of 1-10° C./min under a vacuum degree of 1-20 Pa and hold temperature for 60-300 min, and ball-milled after natural cooling to obtain a composite lithium salt $xLiOH \cdot yLi_2CO_3 \cdot zLi_2O$, wherein x, y and z are mass fractions, and $0<x<0.5$, $0<y<0.5$, $0.5 \leq z<1$, and $x+y+z=1$;
    the lithium raw material is one or at least two of lithium hydroxide-lithium carbonate, lithium hydroxide-lithium carbonate-lithium oxalate and lithium hydroxide-lithium oxalate, and the ball-milled composite lithium salt has a particle size of 20 μm≤D50≤70 μm and a ball-to-material mass ratio of (10-15):1.

3. The method for preparing a ultrathin metal lithium foil according to claim 1, wherein in step (2), the composite lithium salt is uniformly mixed with a reducing agent according to a mass ratio of 1:(0.5-1.0), compressed into a cake under 10-60 MPa, and subjected to vacuum thermal reduction in a vacuum reduction furnace at 800-1000° C. and under a vacuum degree of 1-20 Pa to generate metal vapor;
    the reducing agent is selected from one or at least two of a silicon powder, an aluminum powder, an iron powder and a carbon powder.

4. The method for preparing a ultrathin metal lithium foil according to claim 1, wherein in step (3), the metal vapor is introduced into a distillation tank via a heat exchange pipe and subjected to distillation, a temperature of the distillation tank is controlled at 300-400° C., and a vacuum degree is controlled at $10^{-2}$-$10^{-4}$ Pa, and thus lithium vapor in the metal vapor is condensed into metal lithium liquid, and the metal lithium liquid is stored in a lithium storage tank via a connection pipe, wherein the metal vapor in the heat exchange pipe is cooled from 800-1000° C. to 400-500° C., and a heat exchange liquid in the heat exchange pipe is heated at the same time, the heat exchange pipe is connected to a heat exchange jacket around the distillation tank, the distillation tank is heated to 300-400° C. via the heat exchange liquid and a heating device, and a ceramic filter with a pore size of 1-10 μm is arranged inside the heat exchange pipe;
    sodium vapor and potassium vapor in the metal vapor are subjected to secondary distillation via a distillation pipe connected to the distillation tank, and thus the sodium vapor and the potassium vapor are condensed in a sodium-potassium condensation tank, a thermal insulation sleeve and a heating device are arranged outside the distillation pipe with an inner temperature of 320-420° C.

5. The method for preparing a ultrathin metal lithium foil according to claim 1, wherein in step (4), the metal lithium liquid in the lithium storage tank is introduced into a crucible of a vacuum evaporation device, heated to convert to lithium vapor and deposited on a substrate to form a uniform lithium foil, the lithium foil is collected via a substrate winding collection device, and the collected lithium foil is taken out under an inert atmosphere;

a vacuum degree in the vacuum evaporation device is $10^{-2}$-$10^{-4}$ Pa, a crucible heating temperature is 500-700° C., a distance between the crucible and the substrate is 20-50 mm, a winding speed of the winding collection device is 1-5 m/min, the substrate is an aluminum foil or a copper foil, and the inert atmosphere is a nitrogen atmosphere or an argon atmosphere.

6. The method for preparing a ultrathin metal lithium foil according to claim 1, wherein in step (4), a thickness of the prepared lithium foil is 1-20 μm, a lithium purity of the lithium foil is 99.96-99.99 wt %, and a recovery rate of the metal lithium is 81.7-85.0%.

7. A device for preparing a ultrathin metal lithium foil, which is used to implement the method for preparing a ultrathin metal lithium foil according to claim 1, comprising a vacuum reduction furnace (2), a heat exchange pipe (5), a distillation tank (8), a distillation pipe (10), a sodium-potassium condensation tank (12), a lithium storage tank (14), and an evaporation chamber (16);

the vacuum reduction furnace (2) is connected to the distillation tank (8) via the heat exchange pipe (5), the distillation tank (8) is connected to the sodium-potassium condensation tank (12) via the distillation pipe (10), the distillation tank (8) is connected to the evaporation chamber (16) via the lithium storage tank (14).

8. The device for preparing a ultrathin metal lithium foil according to claim 7, wherein the vacuum reduction furnace (2), the heat exchange pipe (5), the distillation tank (8), and the distillation pipe (10) are all provided with a temperature sensor which displays real-time temperature;

a first vacuum pump (21) is arranged at an upper end of the vacuum reduction furnace (2), a feed inlet (1) is arranged at a lower end of the vacuum reduction furnace (2), and a slag storage tank (3) is arranged at a bottom of the vacuum reduction furnace (2);

an upper end of the distillation tank (8) is connected to the distillation pipe (10), a lower end of the distillation tank (8) is connected to a connection pipe (9), the distillation tank (8) is connected to the lithium storage tank (14) via a connection pipe (9), and the lithium storage tank (14) is connected to a vacuum evaporation chamber (16) via a connection pipe (9);

a sodium-potassium collection tank (13) is arranged at a bottom of the sodium-potassium condensation tank (12), and a second vacuum pump (22) is arranged at an upper end of the sodium-potassium condensation tank (12);

a third vacuum pump (23) is arranged at a lower end of the vacuum evaporation chamber (16).

9. The device for preparing a ultrathin metal lithium foil according to claim 7, wherein a cake-forming pressure device (4) is arranged inside the vacuum reduction furnace (2), a heat exchange jacket and a heating unit are arranged outside the distillation tank (8), and a cooling sleeve is arranged around the sodium-potassium condensation tank (12).

10. The device for preparing a ultrathin metal lithium foil according to claim 7, wherein a winding collection device (17), a crucible (18) and a vapor hood (19) are arranged inside the vacuum evaporation chamber (16), the crucible (18) is integrated with the vapor hood (19), and the crucible (18) is located below the vapor hood (19).

\* \* \* \* \*